(12) United States Patent
Takeda

(10) Patent No.: US 7,872,927 B2
(45) Date of Patent: Jan. 18, 2011

(54) SEMICONDUCTOR MEMORY DEVICE AND METHOD OF CONTROLLING POWER SOURCE

(75) Inventor: Koichi Takeda, Tokyo (JP)

(73) Assignee: NEC Corporation, Tokyo (JP)

( * ) Notice: Subject to any disclaimer, the term of this patent is extended or adjusted under 35 U.S.C. 154(b) by 443 days.

(21) Appl. No.: 12/067,265

(22) PCT Filed: Sep. 27, 2006

(86) PCT No.: PCT/JP2006/319812

§ 371 (c)(1),
(2), (4) Date: Mar. 18, 2008

(87) PCT Pub. No.: WO2007/037496

PCT Pub. Date: Apr. 5, 2007

(65) Prior Publication Data

US 2010/0149887 A1 Jun. 17, 2010

(30) Foreign Application Priority Data

Sep. 27, 2005 (JP) ............................ 2005-279458

(51) Int. Cl.
*G11C 7/00* (2006.01)
(52) U.S. Cl. .............................. 365/189.16; 365/185.05
(58) Field of Classification Search ............ 365/189.16, 365/185.05
See application file for complete search history.

(56) References Cited

U.S. PATENT DOCUMENTS 6,314,011 B1 * 11/2001 Keeth et al. .................... 365/51
6,373,753 B1 * 4/2002 Proebsting ............. 365/189.09
6,462,998 B1 * 10/2002 Proebsting .................. 365/205

FOREIGN PATENT DOCUMENTS

JP 11-96768 A 4/1999
JP 2004-259352 A 9/2004

OTHER PUBLICATIONS

K. Zhang, et al., "A 3-GHz 70Mb SRAM in 65nm CMOS Technology with Integrated Column-Based Dynamic Power Supply", ISSCC Dig. Tech. Papers, Feb. 2005, pp. 474-475, IEEE.
M. Yamaoka, et al., "A 300MHz 25μA/Mb Leakage On-Chip SRAM Module Featuring Process-Variation Immunity and Low-Leakage-Active Mode for Mobile-Phone Application Processor", ISSCC Dig. Tech. Papers, Feb. 2005, pp. 480-481, IEEE.

* cited by examiner

*Primary Examiner*—Tuan T. Nguyen
(74) *Attorney, Agent, or Firm*—Sughrue Mion, PLLC

(57) ABSTRACT

A voltage generator that monitors a writing margin as a control amount in order to carry out an optimum power source control when control of a SRAM cell power source is carried out at writing operation, and always keeps the writing margin constant; and a power source selector are included to switch power source voltage at writing. By switching the power source voltage at writing, a semiconductor memory device in which a stable writing operation is achieved without largely deteriorating writing time in the SRAM cell and an ultrahigh speed operation or ultralow power operation can be carried out is obtained.

14 Claims, 15 Drawing Sheets

SEMICONDUCTOR MEMORY DEVICE AND METHOD OF CONTROLLING POWER SOURCE

TECHNICAL FIELD

The present invention relates to a semiconductor memory device, and particularly, the present invention relates to a semiconductor memory device that operates at ultrahigh speed and low voltage by controlling a power source of a SRAM cell so as to keep a writing margin constant, whereby a stable writing operation is achieved.

BACKGROUND ART

Semiconductor devices of recent years have become large-scaled and high speed, and a number of functions are incorporated and systematized. In these semiconductor devices, transistors are miniaturized for a large scale and high speed, whereby operation speed is improved. Further, for systematization, not only various functional blocks including a CPU but also various memory devices are mixed and mounted. In memory devices mixed and mounted on these system LSIs, for example, Static Random Access Memory (SRAM, hereinafter, referred to as a SRAM for short) mixed and mounted for use of a cache memory and the like, transistors constructing an SRAM are to be miniaturized, whereby a large-scaled and/or high-speed operation is promoted.

A general-purpose SRAM will be described with reference to drawings. A memory cell of the SRAM (hereinafter, referred to as a SRAM cell for short) constructed from 6 transistors is shown in FIG. 1. In the case where a word line WL is a low potential, two Complementary Metal Oxide Semiconductor (CMOS) inverters form a loop, whereby it is possible to hold data stably. Namely, one CMOS inverter outputs inverted data of data stored in a storage node V1 to a storage node V2 when the storage node V1 is used as an input, while the other CMOS inverter outputs inverted data of data stored in the storage node V2 to the storage node V1 when the storage node V2 is used as an input.

In the case where the word line WL is accessed to be a high potential, NMOS access transistors N3 and N4 conduct. At this time, the data stored in the storage nodes V1 and V2 are outputted to bit lines BL and /BL that are charged to a high potential, thereby becoming a reading operation of the memory. Moreover, one bit line is discharged to a low potential in accordance with writing data, and data are inputted from the bit lines BL and /BL to the storage nodes V1 and V2, thereby becoming a writing operation of the memory.

There is a CMOS latch circuit as representative one among memory elements constructed from a CMOS gate. In the CMOS latch circuit, a CMOS switch is inserted into a CMOS inverter loop, and the CMOS inverter loop is cut off at a writing operation, whereby a writing input terminal becomes a high impedance state to achieve a stable writing operation.

On the other hand, in a SRAM cell, a CMOS switch for cutting off the inverter loop is omitted because of a small area thereof. Alternatively, by providing a complementary input to the two storage nodes V1 and V2 of the CMOS inverter loop through NMOS access transistors N3 and N4, a writing operation can be carried out without a writing input becoming a high impedance state. In this case, a condition to carry out a writing operation stably is that drive capability of the NMOS access transistors (N3 and N4) is greater than drive capability of the PMOS load transistors (P1 and P2).

However, in SRAMs after the 90 nm generation, a problem that variation in width of transistor drive capability is increased becomes obvious because the transistor is miniaturized for a large scale and a high-speed operation. In other words, possibility that the drive capability of the NMOS access transistor becomes smaller than the drive capability of the PMOS load transistor is heightened. As a result, a problem occurs that data cannot be written in a SRAM cell in which a writing operation condition is not met. This problem may also occur in the case where power source voltage of the overall SRAM is lowered for low power.

In Non-Patent Document 1 (K. Zhang et. al., "A 3-GHz 70 Mb SRAM in 65 nm CMOS Technology with Integrated Column-Based Dynamic Power Supply," ISSCC Dig. Tech. Papers, pp. 474-475, February 2005), measures to ease a writing operation condition are taken with respect to this problem. As well as one shown in FIG. 11 (will be described later), a power source connected to a source terminal of a PMOS load transistor is somewhat stepped down only at a writing operation, whereby gate-source voltage Vgs of the PMOS load transistor is decreased and the drive capability of the load transistor is decreased. Thus, the drive capability of the NMOS access transistors (N3 and N4) becomes greater than the drive capability of the PMOS load transistors (P1 and P2), and a stable writing operation is achieved.

Further, in Non-Patent Document 2 (M. Yamaoka et. al., "Low-Power Embedded SRAM Modules with Expanded Margins for Writing," ISSCC Dig. Tech. Papers, pp. 480-481, February 2005), as shown in FIG. 24, in order to reduce a leakage current of an NMOS cell transistor, a power source Vssm connected to a source terminal of each of NMOS drive transistors (N1 and N2) is cut off from a substrate potential GND while it is not accessed. The power source Vssm is charged due to the leakage current of the SRAM cell, and the power source Vssm converges at a potential somewhat higher than the substrate potential GND. This power source Vssm is applied to a gate terminal of the PMOS load transistor through the NMOS drive transistor that is turned on. Thus, since the gate-source Vgs is decreased and the drive capability of the PMOS load transistor is decreased, an effect that the writing operation condition similar to that in Non-Patent Document 1 is eased is provided.

By carrying out the power source control as described above, a stable writing operation can be carried out even in the SRAMs after the 90 nm generation. However, in the case where the power source control is carried out more than necessary, the drive capability of the PMOS load transistor is deteriorated largely. There is a problem that writing time for charging one of the storage nodes in the SRAM cell from a low potential to a high potential gets longer significantly.

DISCLOSURE OF THE INVENTION

As described above, there is a problem that the drive capability of the load transistor exceeds the drive capability of the access transistor and a writing operation may not be carried out stably in the case where the SRAM cell constructed from conventional 6 transistors is miniaturized and operates with low voltage. In Non-Patent Documents 1, 2, the SRAM cell power source is controlled to decrease the drive capability of the load transistor, whereby a writing operation condition is met. However, there is a problem that, in the case where the power source control is carried out more than necessary, writing time for charging one of the storage nodes in the SRAM cell from a low potential to a high potential gets longer significantly, and time required to control the SRAM cell power source is thereby increased.

The present invention is made to improve the problems described above, and relates to a monitoring circuit that can output a writing margin as a control amount in order to carry out optimum power source control when control of the SRAM cell power source is carried out at a writing operation. It is an object of the present application to provide a semiconductor memory device that can carry out an ultrahigh speed operation or ultralow power operation without significantly lengthening writing time in a SRAM cell by carrying out power source control so that a stable writing operation is achieved.

A semiconductor memory device of the present invention is a semiconductor memory device including a writing margin monitoring circuit, the writing margin monitoring circuit including a simulation circuit in which a replicated load transistor and a replicated access transistor are connected in series, the replicated load transistor and the replicated access transistor respectively simulating a load transistor and an access transistor of a SRAM cell so that a current flowing to the access transistor that discharges a potential of a storage node of the SRAM cell equals a current flowing to the load transistor of the SRAM cell at a writing operation.

In the semiconductor memory device of the present invention, the writing margin monitoring circuit further includes a second replicated load transistor, a replicated inverter circuit constructed from a replicated drive transistor and an operational amplifier, the replicated inverter circuit outputs a second output signal when a first output signal is inputted from the simulation circuit, the first output signal and the second output signal are inputted to the operational amplifier, and an output signal of the operational amplifier that is an output signal of the writing margin monitoring circuit is outputted as gate voltage of the replicated access transistor.

In the semiconductor memory device of the present invention, voltage of the first output signal is equal to threshold value voltage of first and second inverters that configure the SRAM cell and are loop-connected.

In the semiconductor memory device of the present invention, each of the replicated load transistor and the second replicated load transistor is constructed from a transistor having the same characteristic as that of the load transistor that configures the SRAM cell, the replicated access transistor is constructed from a transistor having the same characteristic as that of the access transistor that configures the SRAM cell, and the replicated drive transistor is constructed from a transistor having the same characteristic as that of a drive transistor that configures the SRAM cell.

In the semiconductor memory device of the present invention, an output signal from a node at which a second replicated access transistor is connected to a second replicated drive transistor in series is inputted to a gate of the replicated load transistor.

In the semiconductor memory device of the present invention, low power source voltage is inputted to a gate of the replicated load transistor.

The semiconductor memory device of the present invention further includes a voltage generator and a power source selector, wherein the power source selector switches second high power source voltage or second low power source voltage generated by the voltage generator to apply it as a power source of the SRAM cell at writing.

In the semiconductor memory device of the present invention, the voltage generator outputs the second power source voltage or the second low power source voltage by controlling an output transistor by means of an output of an operational amplifier to which reference voltage that is lowered by margin voltage from high power source voltage and output voltage from the writing margin monitoring circuit are inputted.

In the semiconductor memory device of the present invention, the writing margin monitoring circuit further includes a second replicated load transistor, a replicated inverter circuit constructed from a replicated drive transistor, an operational amplifier and a voltage generator, the replicated inverter circuit outputs a second output signal when a first output signal is inputted from the simulation circuit, the first output signal and the second output signal are inputted to the operational amplifier, and the voltage generator outputs second high power source voltage or second low power source voltage by controlling an output transistor by means of an output signal from the operational amplifier.

In the semiconductor memory device of the present invention, reference voltage that is lowered by margin voltage from high power source voltage is inputted to a gate of the replicated access transistor.

In the semiconductor memory device of the present invention, either the second high power source voltage and low power source voltage or high power source voltage and the second low power source voltage are applied as a power source of the replicated inverter circuit.

The semiconductor memory device of the present invention further includes a power source selector, wherein the power source selector switches the second high power source voltage or the second low power source voltage to apply it as a power source of the SRAM cell at writing.

A method of controlling a power source of a semiconductor memory device of the present invention is a method in which the semiconductor memory device includes a simulation circuit, a replicated inverter circuit, an operational amplifier, a voltage generator and a power source selector, the simulation circuit being constructed from a replicated load transistor and a replicated access transistor that respectively simulate a load transistor and an access transistor that configure a SRAM cell, the replicated inverter circuit being constructed from second replicated load transistor and replicated drive transistor to which an output from the simulation circuit is inputted, outputs from the simulation circuit and the replicated inverter circuit being inputted to the operational amplifier, the voltage generator generating second high power source voltage or second low power source voltage by means of an output from the operational amplifier, wherein when a writing instruction is inputted, the power source selector applies either the second high power source voltage and low power source voltage or high power source voltage and the second low power source voltage as a power source of the SRAM cell.

In the method of controlling the power source of the semiconductor memory device of the present invention, when a writing instruction is inputted, the power source selector applies the second high power source voltage and the low power source voltage or the high power source voltage and the second low power source voltage as a power source of the replicated inverter circuit.

In the semiconductor memory device, in spite of a change of an operation environment such as process variation, temperature and power source voltage, a writing margin of the SRAM cell is monitored, and the writing margin is always kept constant. A power source is generated so that the writing margin becomes constant to control application of the power source to the SRAM cell. By constructing in these manners, there is an effect that a stable and high-speed operation of a writing operation of the SRAM cell can be obtained.

BEST MODE FOR CARRYING OUT THE INVENTION

A writing margin monitoring circuit of the present invention and a voltage generator for controlling a memory cell power source in accordance with its output value will be described in detail with reference to drawings.

Embodiment 1

Figure 1:
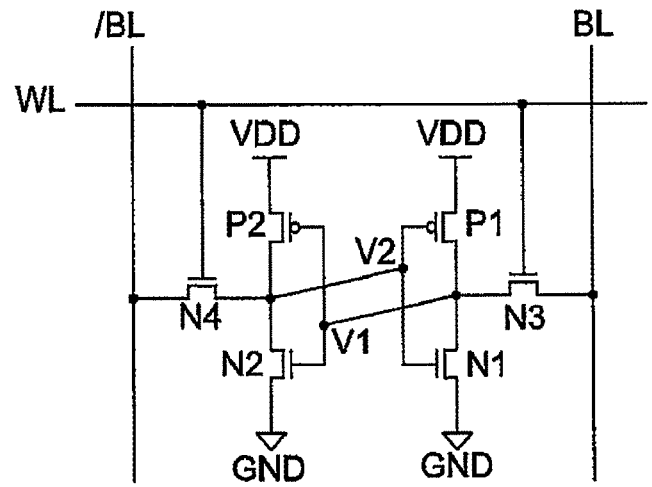
FIG. 1 is a circuit diagram of a conventional 6 transistor SRAM cell.
Figure 2:
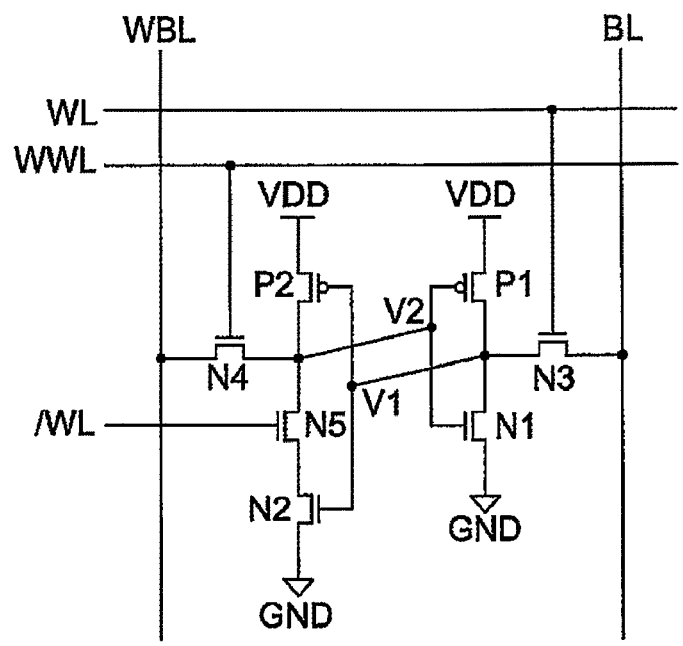
FIG. 2 is a circuit diagram of a conventional 7 transistor SRAM cell.
Figure 3:
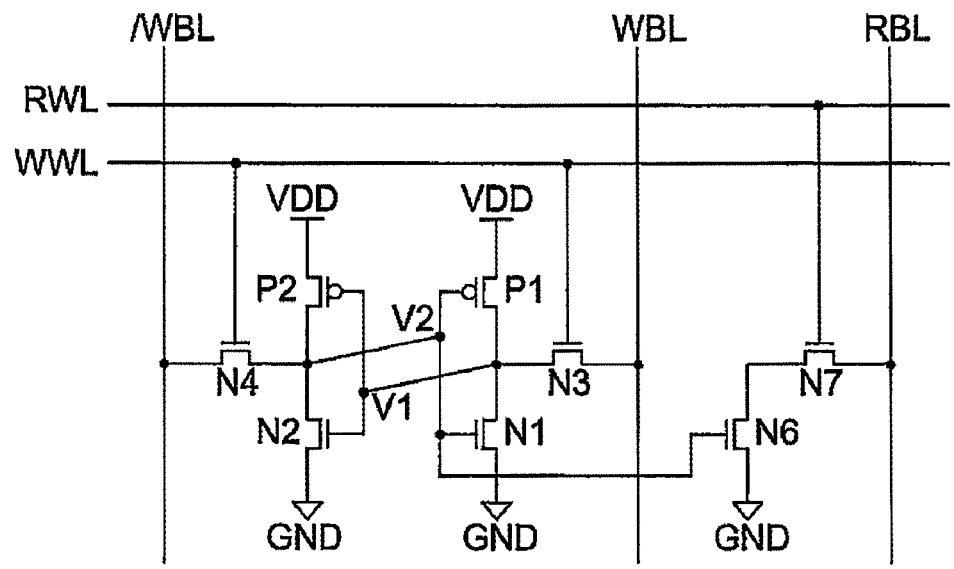
FIG. 3 is a circuit diagram of a conventional 8 transistor SRAM cell.
Figure 4:
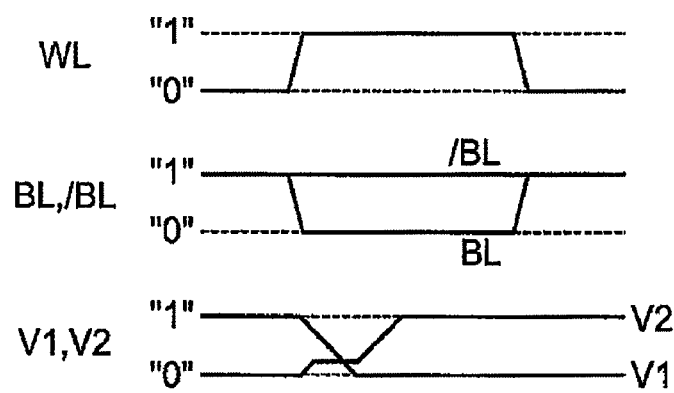
FIG. 4 is a waveform diagram of a writing operation in the SRAM cell of FIG. 1.
Figure 5:
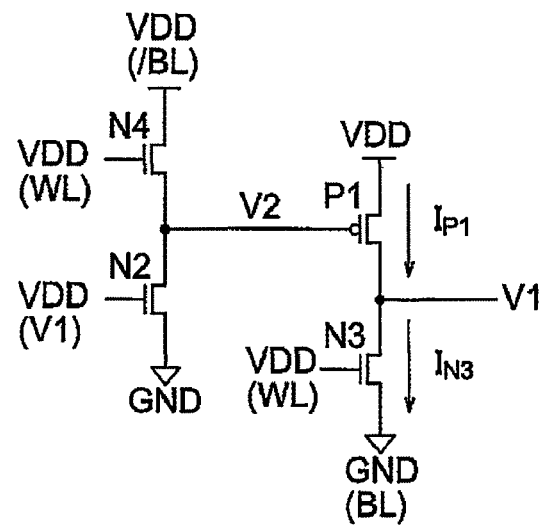
FIG. 5 is an explanatory drawing for explaining an essential condition to carry out a stable writing operation in the SRAM cell of FIG. 1.
Figure 6:
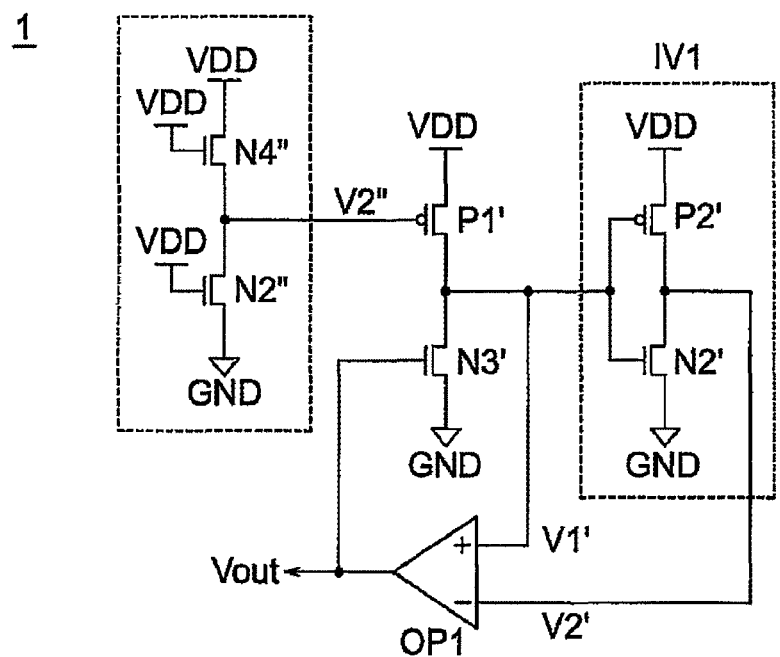
FIG. 6 is a circuit diagram of a writing margin monitoring circuit.
Figure 7:
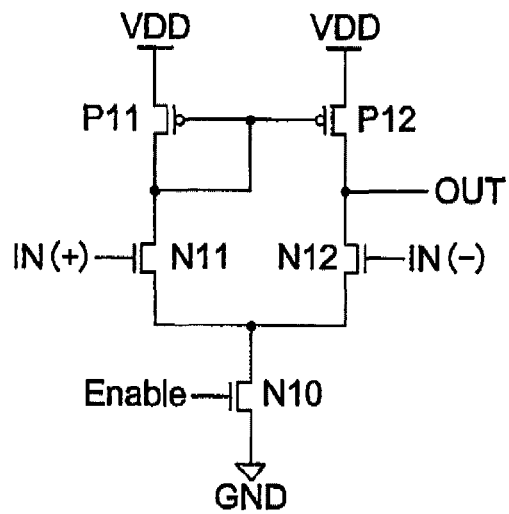
FIG. 7 is a circuit diagram of an operational amplifier that constructs the writing margin monitoring circuit.

A writing margin monitoring circuit that monitors a margin at a writing operation will be described as Embodiment 1 of the present invention with reference to FIGS. 1 to 7. Known memory cell circuits respectively constructed from 6 transistors, 7 transistors and 8 transistors, to which a margin monitoring circuit and a method of controlling a power source of the present invention can be applied, are shown in FIGS. 1, 2 and 3. An operation waveform diagram for explaining a writing operation in the SRAM cell of FIG. 1 is shown in FIG. 4, and an explanatory drawing for explaining an essential condition to carry out a stable writing operation is shown in FIG. 5. A circuit diagram of a writing margin monitoring circuit diagram is shown in FIG. 6, and a circuit diagram of an operational amplifier configuring the writing margin monitoring circuit is shown in FIG. 7.

FIGS. 1, 2 and 3 are examples of a SRAM cell to which the present invention can be applied, and are diagrams respectively showing conventional SRAM cells constructed from 6, 7 and 8 transistors. As a basic configuration of these SRAM cell, one CMOS inverter is constructed from a PMOS load transistor P1 and an NMOS drive transistor N1, and another CMOS inverter is constructed from a PMOS load transistor P2 and an NMOS drive transistor N2. By loop-connecting these two CMOS inverters, it is possible to hold storage data stably.

In the case where data stored in these SRAM cell are rewritten, the two NMOS access transistors N3, N4, which are connected to respective storage nodes, are caused to conduct together, and a bit line connected to the one NMOS access transistor is discharged to a substrate potential GND. In the SRAM cell of 7 transistors shown in FIG. 2, a control transistor N5 is inserted between the PMOS load transistor P2 and the NMOS drive transistor N2. Further, a word line is divided to a word line WL used for writing and reading and a writing word line WWL for only writing. This control transistor N5 is caused not to conduct at writing, and a storage node V2 rises to "1" fast, whereby it is easier to carry out writing.

Further, transistors N6, N7 for reading are added to the SRAM cell of FIG. 3. A bit line is divided to WBL and /WBL for writing and RBL for reading. In addition, a word line is also divided to a reading word line RWL used for reading and a writing word line WWL used for writing. Even in the case where data of these SRAM cells are rewritten, it could readily be understood to carry out in the same manner as the 6-transistor SRAM cell.

FIG. 4 shows an operation waveform for explaining a writing operation in the SRAM cell of FIG. 1. A word line WL is activated to become "1", and a bit line BL is discharged to "0", whereby a storage node V1 is discharged from "1" to "0". When the storage node V1 becomes "0", a PMOS load transistor P2 is turned on, and a storage node V2 is charged from "0" to "1". When the storage node V2 becomes "1", the writing operation is completed.

An explanatory drawing at this writing operation is shown in FIG. 5. An essential condition for carrying out a stable writing operation is that a driving current I_N3 of an NMOS access transistor N3 in the case of discharging a storage node V1 is larger than a driving current I_P1 of a PMOS load transistor P1. Thus, by controlling a gate potential of the NMOS access transistor N3 so that the I_N3 equals the I_P1, a difference between gate potentials Vout when the driving currents are balanced with each other with respect to power source voltage VDD is defined as a writing margin.

A writing margin monitoring circuit 1 that generates a potential Vout corresponding to the writing margin is shown in FIG. 6. The writing margin monitoring circuit 1 is constructed from transistors N2", N4", transistors P1', N3', transistors P2', N2' and operational amplifier OP1.

Drain, source and gate of the transistor N2" are connected to an output node V2", a substrate potential GND and a power source VDD, respectively. Drain, source and gate of the transistor N4" are connected to a power source VDD, the output node V2" and a power source VDD, respectively. Source, drain and gate of the transistor P1' are connected to a power source VDD, an output node V1' and the output node V2", respectively. Drain, source and gate of the transistor N3' are connected to the output node V1', a ground potential GND and an output node Vout of the operational amplifier OP1, respectively.

Source, drain and gate of the transistor P2' are connected to a power source VDD, an output node V2' and the output node V1', respectively. Drain, source and gate of the transistor N2' are connected to the output node V2', a ground potential GND and the output node V1', respectively. A CMOS inverter IV1 is constructed from the transistor P2' and the transistor N2'. The margin monitoring circuit 1 is configured from these transistors, and the operational amplifier OP1 to which the output nodes V1 and V2 are inputted and which outputs the output Vout.

Here, each of the PMOS transistors P1', P2' is constructed from a transistor having the same conditions (threshold value voltage and applied voltage) as those of each of the PMOS load transistors P1, P2 that configure the SRAM cell. Similarly, each of the NMOS transistors N2', N2" is constructed from a transistor having the same conditions as those of each of the NMOS drive transistors N1, N2 that configure the SRAM cell, and each of the NMOS transistors N3', N4" is constructed from a transistor having the same conditions as those of each of the NMOS access transistors N3, N4 that configure the SRAM cell.

When the transistors that configure the monitoring circuit are caused to have the same conditions as those of the transistors that configure the SRAM cell in this manner, the monitoring circuit reproduces a state at writing of the SRAM cell in a simulated manner. In the SRAM cell of FIG. 1, for example, in the case where '0' and '1' are respectively rewritten into the bit line BL and the bit line /BL, the levels of the power source voltage VDD and the word line are set to VDD. Since both gate potentials of the transistors N4, N2 in the SRAM cell are the power source VDD at the start of a writing operation, the power source VDD is respectively applied as gate potentials of the transistors N4", N2". Each of the transistors N4", N2" at the bit line /BL side is caused to conduct to output the output V2" to the gate of the PMOS transistor P1'.

The drain of the PMOS transistor P1' to the gate of which this output V2" is inputted and which generates a driving current I_P1, and the drain of the NMOS transistor N3' that generates a driving current I_N3 are commonly connected. The node becomes the output node V1' whose potential goes up or down depending on a size of the driving current of each of the transistors P1', N3'. A circuit formed from the PMOS transistor P1' and the NMOS transistor N3' can monitor stable operation conditions of writing of the SRAM cell, and thus, it is called a simulation circuit. The output node V1' is inputted to the CMOS inverter IV1, and the CMOS inverter IV1 outputs the output node V2'. The output nodes V1' and V2' are inputted to the operational amplifier OP1, and the operational amplifier OP1 outputs the Vout to control a gate potential of the transistor N3'.

As shown in FIG. 7, the operational amplifier OP1 is constructed from NMOS differential pair transistors N11, N12, transistors P11, P12 that form a PMOS current mirror, and a NMOS current source transistor N10. The configuration of the operational amplifier OP1 is not limited to that shown in FIG. 7, and for example, the configuration in which polarities of any transistor are inverted can also be applied. The operational amplifier OP1 controls the gate potential Vout of the NMOS transistor N3' so that the potential of the node V1' converges in the vicinity of a logical threshold value of the CMOS inverter IV1. Thus, a difference between the VDD of the power source voltage and the potential Vout is acquired as the writing margin.

The transistors that determine the respective node voltage in the writing margin monitoring circuit 1 are caused to be transistors similar to the transistors in the SRAM cell in this manner. Thus, this writing margin monitoring circuit 1 is a replica circuit of the SRAM cell, and it reproduces the respective node voltage of the SRAM cell at writing. By inputting the output nodes V1, V2 into the operational amplifier, it controls so that the driving current I_PI of the PMOS transistor P1' equals the driving current I_N3 of the NMOS transistor N3' at writing by means of the output of the operational amplifier.

In this writing margin monitoring circuit 1, the gate voltage of each of the transistors N4", N2" is set to the power source VDD. However, in an actual SRAM cell, the gate potential of the transistor N2 is a storage node V1, and it is lowered from the power source VDD, the output node V" is heightened, and the driving current of the transistor P1' is lowered. Thus, this circuit corresponds to a worst state at the beginning of writing.

In the present embodiment, the writing margin monitoring circuit that outputs the lowest voltage Vout of the word line, at which the writing can be carried out, is obtained. The condition that writing can be carried out is that the driving current I_N3 of the NMOS access transistor N3 when the storage node V1 is discharged is larger than the driving current I_P1 of the PMOS load transistor P1. The transistors of the writing margin monitoring circuit are configured from the same transistors as the transistors in the SRAM cell. The potential Vout of the word line at which the driving current I_N3 equals the driving current I_P1 is acquired, and a difference between the power source VDD and the potential Vout is obtained as a writing margin.

Embodiment 2

Figure 8:
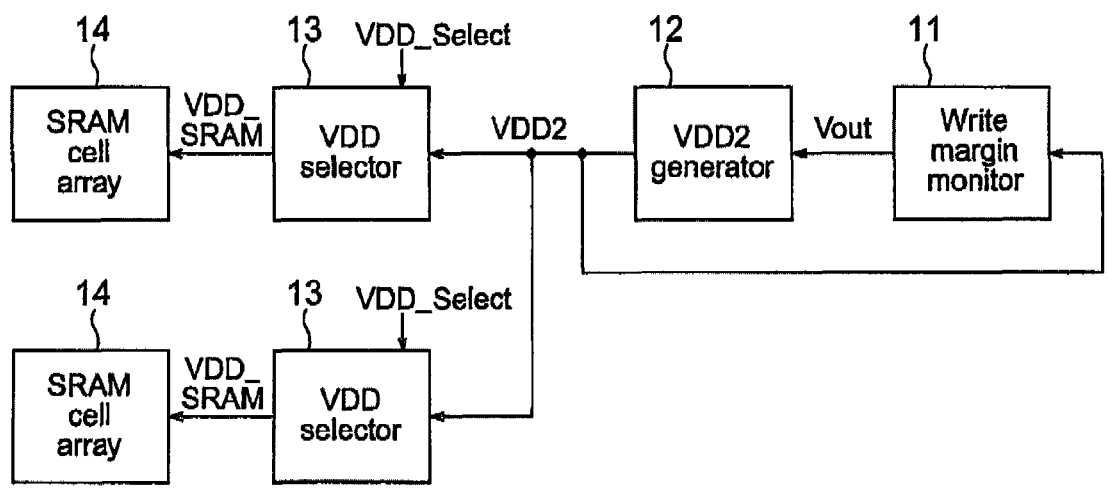
FIG. 8 is an overall block diagram in the case where the writing margin monitoring circuit is applied to control a power source VDD_SRAM of a SRAM cell according to Embodiment 2.
Figure 9:
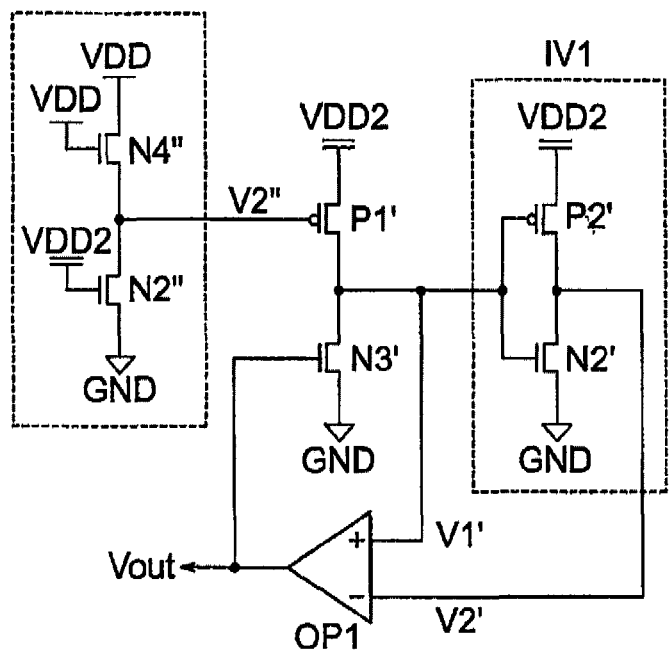
FIG. 9 is a circuit diagram of a writing margin monitoring circuit 11 according to Embodiment 2.
Figure 10:
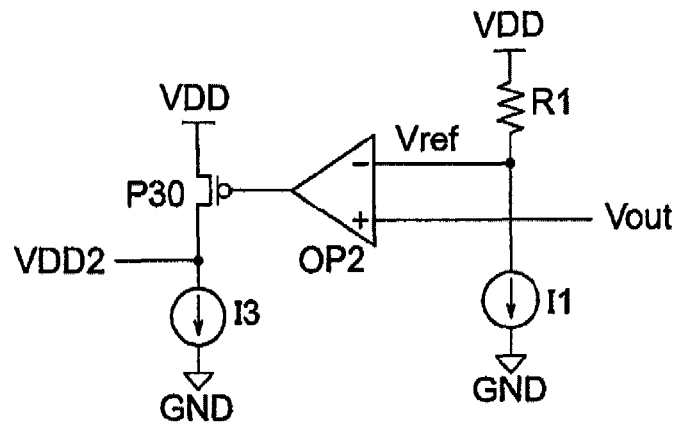
FIG. 10 is a circuit diagram of a VDD2 voltage generator 12 that generates power source voltage VDD2 according to Embodiment 2.
Figure 11:
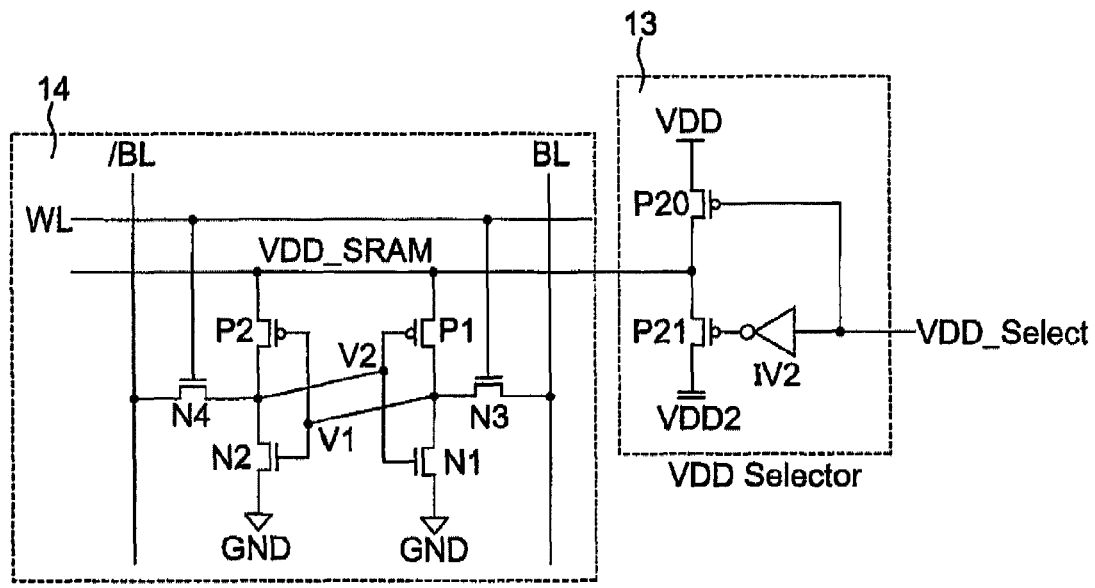
FIG. 11 is a connection diagram between a SRAM cell array 14 and a VDD selector 13 according to Embodiment 2.

The case where the writing margin monitoring circuit of Embodiment 1 is used for control of a power source VDD_SRAM of a SRAM cell will be described as Embodiment 2 of the present invention with reference to FIGS. 8 to 12. FIG. 8 is a diagram showing a overall block in the case where the writing margin monitoring circuit 1 is used for control of the power source VDD_SRAM of the SRAM cell. A writing margin monitoring circuit 11 is shown in FIG. 9, a VDD2 voltage generator 12 that generates power source voltage VDD2 is shown in FIG. 10, and a connection diagram between a SRAM cell array 14 and a VDD selector 13 is shown in FIG. 11. Another writing margin monitoring circuit is shown as another embodiment in FIG. 12.

FIG. 8 is a diagram showing a block configuration in the case where the writing margin monitoring circuit is used for control of the power source VDD_SRAM of the SRAM cell.

The present embodiment is an embodiment in which power source voltage VDD and second power source voltage VDD2 are switched and applied as a high power source VDD_SRAM of the SRAM cell. It is constructed from the writing margin monitoring circuit 11, the voltage generator 12, the VDD selector 13 and the SRAM cell array 14. The voltage generator 12 generates the second power source voltage VDD2 so that a writing margin, which is a difference between the power source voltage VDD and the output Vout of the writing margin monitoring circuit 11, always becomes constant. The VDD selector 13 selects the power source voltage VDD2 and the power source voltage VDD in accordance with an access mode to apply it to the high power source VDD_SRAM of the SRAM cell array 14. At this time, the power source voltage VDD2 is also applied to the writing margin monitoring circuit 11 that is a replica of the SRAM cell in the similar manner.

The writing margin monitoring circuit 11 in the case of controlling the high power source VDD_SRAM is shown in FIG. 9. In order to provide the voltage applied to the monitoring circuit 11 the same conditions as those of the SRAM cell array, power source voltage VDD2 is connected to each of source terminals of the PMOS transistors P1', P2' and a gate terminal of the NMOS transistor N2". The other configuration is similar to that in the writing margin monitoring circuit 1 according to Embodiment 1, and the operations are also similar to those of Embodiment 1. Thus, detailed description thereof is omitted.

FIG. 10 shows a configuration example of the VDD2 voltage generator 12 that generates the power source voltage VDD2. A writing margin WM1 (=R1×I1) necessary for a stable operation is determined by a resistance element R1 and a constant current source I1, and voltage (VDD−WM1) is outputted as a reference potential Vref. An operational amplifier OP2, a constant current source I3 and a PMOS transistor P30 generate the power source voltage VDD2 so that the output Vout of the writing margin monitoring circuit 2 equals the reference potential Vref.

The SRAM cell array 14 and the VDD selector 13 are shown in FIG. 11. A mode selection signal VDD_Select is "0" at a reading operation, and a PMOS transistor P20 is turned on. This makes power source voltage VDD to be applied to a high power source VDD_SRAM of the SRAM cell array 14. The mode selection signal VDD_Select is "1" at a writing operation, a CMOS inverter IV2 outputs "0", and a PMOS transistor P21 is turned on. This makes power source voltage VDD2 to be applied to the high power source VDD_SRAM of the SRAM cell array 14.

At a writing operation, the power source voltage VDD2 is applied to the high power source VDD_SRAM of the SRAM cell array 14. The power source voltage VDD2 is voltage lower than the power source voltage VDD by a writing margin WM1. For that reason, a current IP1 flowing to a load transistor P1 at writing becomes a small current, whereby an effect that writing is carried out at high speed is obtained.

Figure 12:
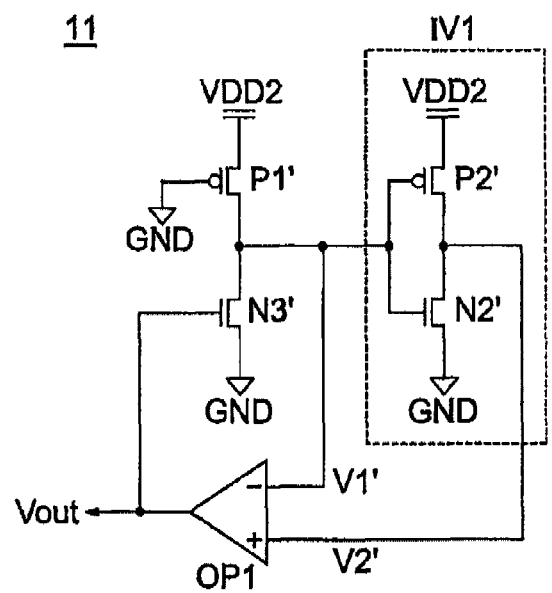
FIG. 12 is a circuit diagram of another form of the writing margin monitoring circuit 11 according to Embodiment 2.

Another form of the writing margin monitoring circuit 11 is shown in FIG. 12. It is a configuration in which the transistors N2", N4" that generate a potential of the node V2" are omitted from the circuit configuration of FIG. 9. The output potential Vout becomes somewhat higher in order for the potential of the node V2" to become a substrate potential GND. However, an error can be compensated by making a value of the resistance element R1 in VDD2 generator to be somewhat small. Since one constant current path is deleted, electrical power can be made lower.

The present embodiment has a configuration in which the power source voltage VDD or VDD2 is switched as the high power source voltage of the SRAM cell array. The power source voltage VDD2 that is lowered by a potential difference of a writing margin WM1 from the power source voltage VDD is applied as the high power source voltage of the SRAM cell array at writing. By switching to the power source voltage VDD2 at writing, a semiconductor memory device that can carry out a stable operation at high speed is obtained.

Embodiment 3

Figure 13:
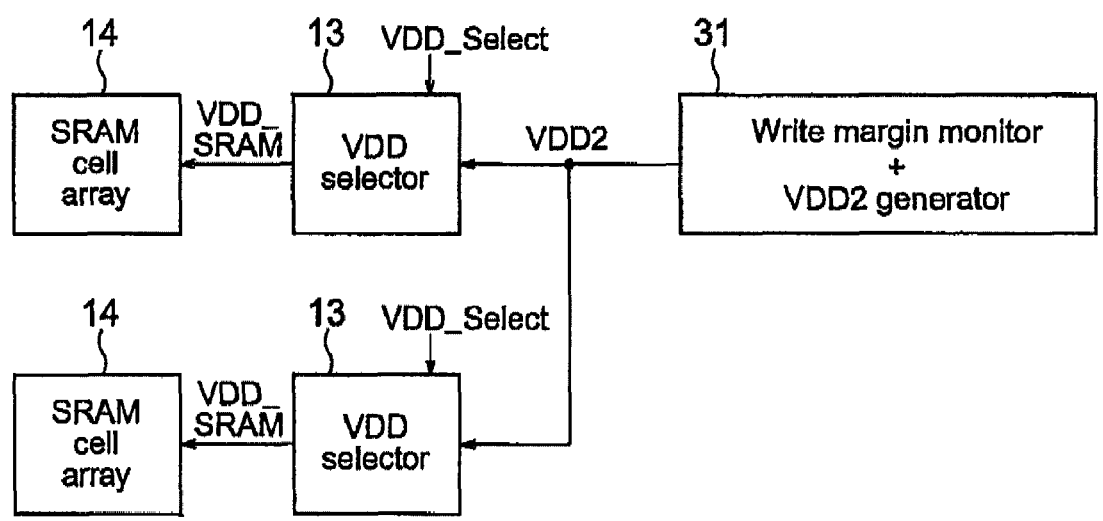
FIG. 13 is an overall block diagram in the case where a writing margin/voltage generator 31 is applied to control a power source VDD_SRAM of a SRAM cell according to Embodiment 3.

Embodiment 3 of the present invention will be described with reference to FIGS. 13 to 15. The present embodiment is an embodiment in which the writing margin monitoring circuit 11 and the VDD2 voltage generator 12 are integrated. FIG. 13 is a diagram showing a block configuration in the case where a writing margin monitor/voltage generator 31 is used for control of a high power source VDD_SRAM of a SRAM cell. A circuit diagram of a writing margin monitor/power source generator is shown in FIG. 14, and a circuit diagram of another writing margin monitor/power source generator is shown as another form in FIG. 15.

Figure 14:
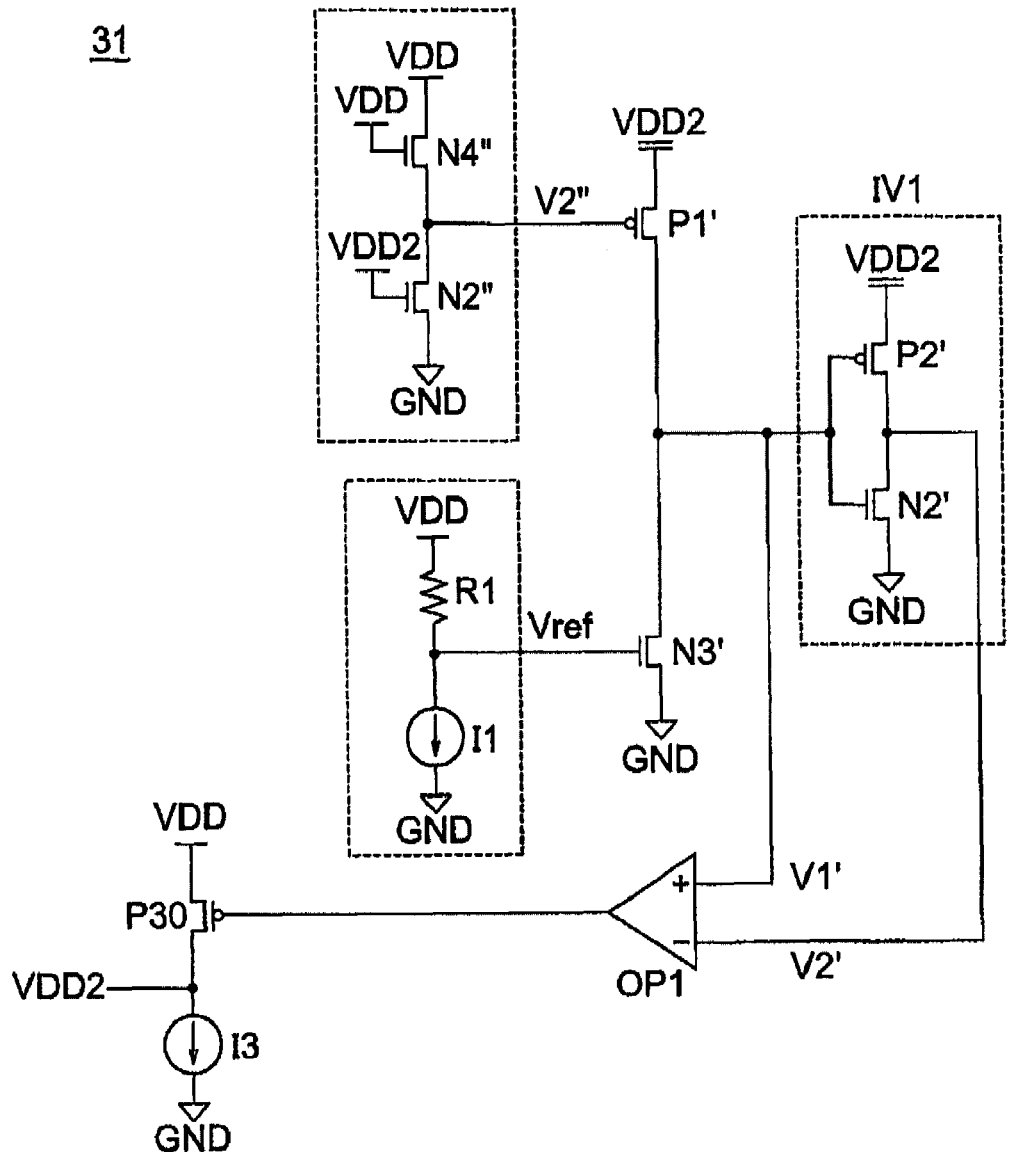
FIG. 14 is a circuit diagram of the writing margin/voltage generator 31 according to Embodiment 3.

The writing margin monitor/voltage generator 31 shown in FIG. 14 integrates the writing margin monitoring circuit 11 of FIG. 9 and the voltage generator 12 of FIG. 10. In a writing margin monitoring circuit portion, a reference potential Vref is directly inputted as a gate input of a transistor N3' that configures a simulation circuit. In a voltage generator portion, an operational amplifier OP2 is omitted, and an output Vout of the operational amplifier OP1 in the writing margin monitoring circuit portion is inputted to a gate of a transistor P30. By causing the transistor P30 to be controlled, the power source voltage VDD2 is outputted.

The reference potential Vref is inputted to a gate of a transistor N3'. The output Vout of the operational amplifier OP1 to which the output V1' and the output V2' of an inverter IV1 are inputted is inputted to the gate of the transistor P30 of the voltage generator. In the voltage generator portion to which the output Vout of the operational amplifier OP1 is inputted, the power source voltage VDD2 is generated. The power source voltage VDD2 is controlled so that the potential Vref equals the output Vout of the writing margin monitoring circuit portion in this manner. The writing margin monitor/voltage generator 31 integrates the writing margin monitoring circuit and the voltage generator, whereby it is possible to omit the operational amplifier OP2.

Figure 15:
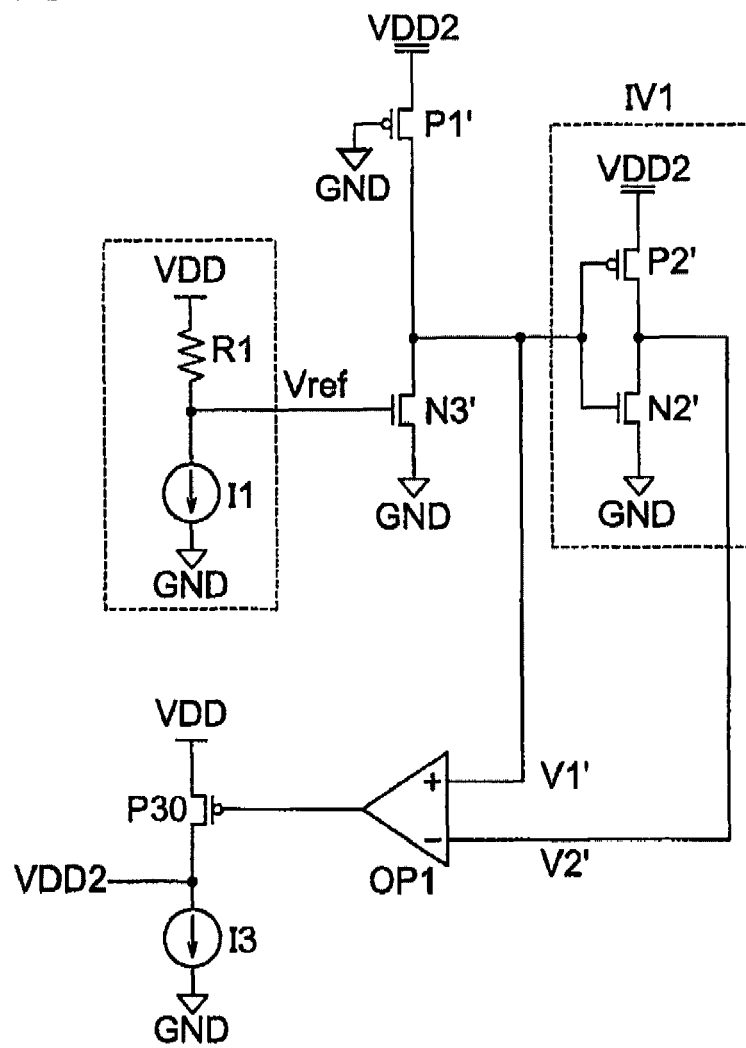
FIG. 15 is a circuit diagram showing another form of the writing margin/voltage generator 31 according to Embodiment 3.

Moreover, another form of the voltage generator 31 shown in FIG. 15 is a configuration in which the transistors N2", N4" that generate a potential of the node V2" are omitted. Alternatively, a substrate potential GND is applied to the gate of the PMOS transistor P1'. In order for the potential of the PMOS transistor P1' to become the substrate potential GND, a current of the PMOS transistor P1' increases somewhat. However, an error can be compensated by making a value of the resistance element R1 that generates the reference potential Vref to be somewhat small. Since one constant current path is deleted, electrical power can be made lower.

The present embodiment has a configuration in which the power source voltage VDD or VDD2 is switched as the high power source voltage of the SRAM cell array and the writing margin monitoring circuit and the voltage generator are integrated. In the similar manner to Embodiment 2, the power source voltage VDD2 that is lowered by a writing margin WM1 from the power source voltage VDD is applied as the power source voltage of the SRAM cell array at writing. By switching to the power source voltage VDD2 at writing, a semiconductor memory device that can carry out a stable operation at high speed is obtained.

Embodiment 4

Figure 16:
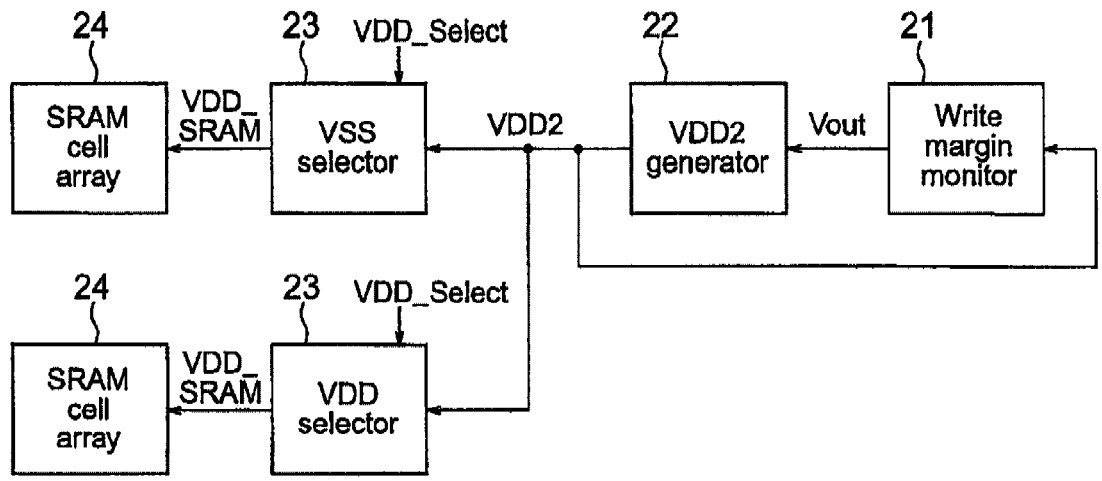
FIG. 16 is an overall block diagram in the case where a writing margin monitoring circuit 21 is applied to control a power source VSS_SRAM of a SRAM cell according to Embodiment 4.
Figure 17:
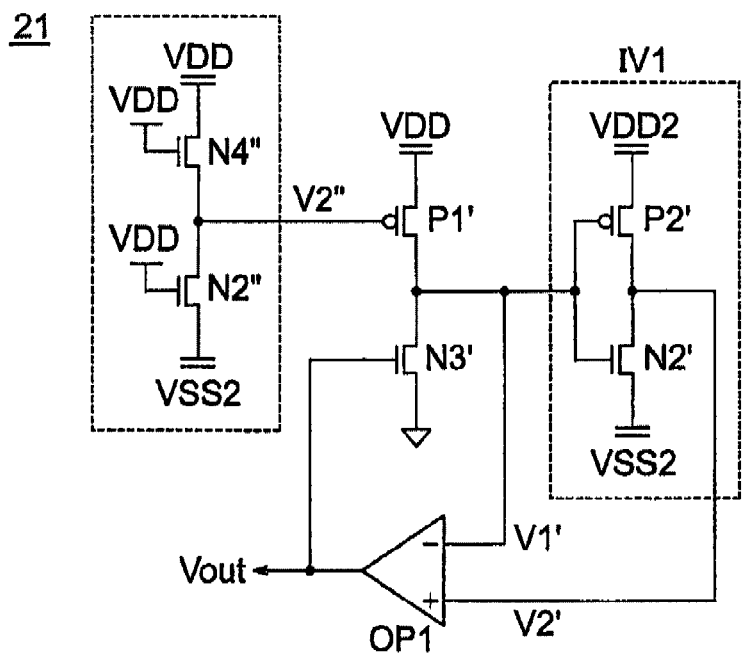
FIG. 17 is a circuit diagram of the writing margin monitoring circuit 21 according to Embodiment 4.
Figure 18:
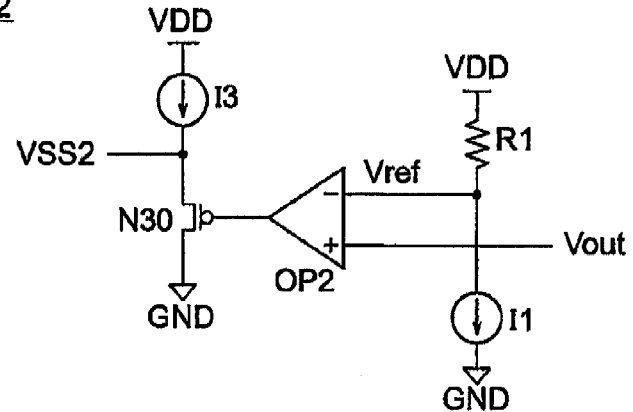
FIG. 18 is a circuit diagram of a VSS2 voltage generator 22 that generates power source voltage VSS2 according to Embodiment 4.
Figure 19:
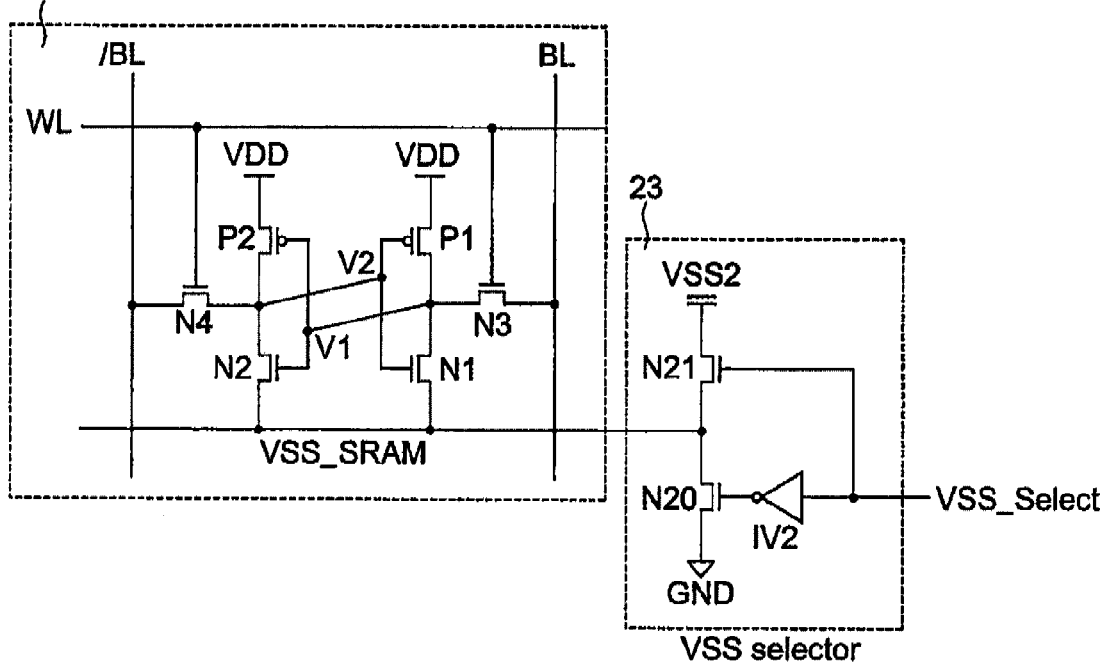
FIG. 19 is a connection diagram between a SRAM cell array 24 and a VSS selector 23 according to Embodiment 4.
Figure 20:
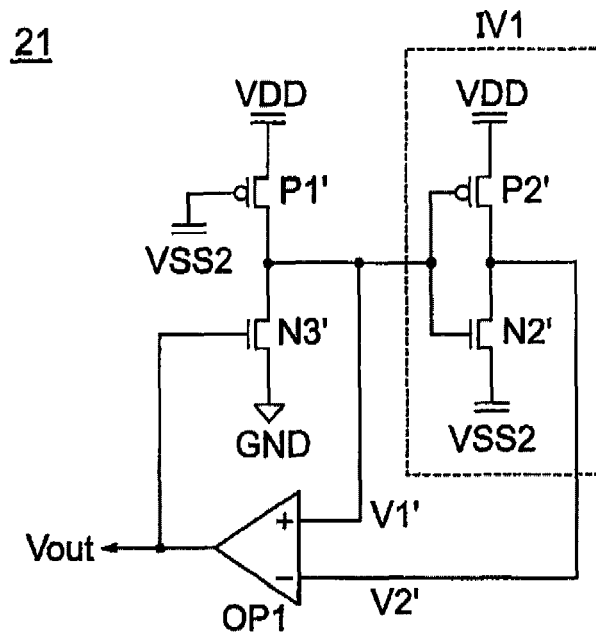
FIG. 20 is a circuit diagram of another form of the writing margin monitoring circuit 21 according to Embodiment 4.

Embodiment 4 of the present invention will be described with reference to FIGS. 16 to 20. The present embodiment is an embodiment in which low power source voltage is switched. FIG. 16 shows a block configuration diagram in the case where the writing margin monitoring circuit is used for control of a low power source VSS_SRAM of a SRAM cell. A writing margin monitoring circuit 21 in the case of controlling the low power source VSS_SRAM is shown in FIG. 17. FIG. 18 shows a configuration example of a VSS voltage generator that generates low power source voltage VSS2. FIG. 19 shows a SRAM cell array and a VSS selector, and another form of the writing margin monitoring circuit is shown in FIG. 20.

FIG. 16 is a diagram showing a block configuration in the case where the writing margin monitoring circuit 21 is used for control of the low power source VSS_SRAM of the SRAM cell. The present embodiment is an embodiment in which in the SRAM cell, low power source voltage (substrate potential) GND and low power source voltage VSS2 are switched and applied to the low power source voltage VSS_SRAM as low power source voltage in accordance with an access mode. The overall block is constructed from the writing margin monitoring circuit 21, a VSS2 voltage generator 22, a VSS selector 23 and a SRAM cell array 24. The VSS2 voltage generator 22 generates the power source voltage VSS2 so that a writing margin, which is a difference between the power source voltage VDD and the output Vout of the writing margin monitoring circuit 21, always becomes constant. The VSS selector 23 select the low power source voltage VSS2 and the substrate potential GND as the low power source voltage in accordance with an access mode to apply it to the low power source VSS_SRAM of the SRAM cell array 24.

The writing margin monitoring circuit 21 in the case of controlling the low power source VSS_SRAM is shown in FIG. 17. In order for the voltage applied to the writing margin monitoring circuit 21 to be the same condition as that of the SRAM cell array, the power source voltage VSS2 is connected to a source terminal of each of the NMOS transistors N2", N2'. Since other configuration and operation thereof are similar to those in FIG. 6, the description thereof is omitted.

FIG. 18 shows a configuration example of the VSS2 voltage generator 22 that generates the power source voltage VSS2. A writing margin WM1 (=R1×I1) necessary for a stable operation is determined by a resistance element R1 and a constant current source I1, and VDD−WM1 is outputted as the reference potential Vref. The operational amplifier OP2, the constant current source I2 and the NMOS transistor N30 generate the power source voltage VSS2 so that the output Vout of the writing margin monitoring circuit 21 equals the reference potential Vref. The power source voltage VSS2 becomes voltage higher than the substrate potential GND.

FIG. 19 shows the SRAM cell array 24 and the VSS selector 23. A mode selection signal VSS_Select is "0" at a reading operation, and the CMOS inverter IV2 outputs "1". The NMOS transistor N20 is turned on, and the substrate potential GND is applied to the power source VSS_SRAM of the SRAM cell. The mode selection signal VSS_Select is "1" at a writing operation, and the NMOS transistor N21 is turned on. This makes the power source voltage VSS2 to be applied to the power source VSS_SRAM of the SRAM cell.

Another form of the writing margin monitoring circuit 21 is shown in FIG. 20. It is a configuration in which the transistor N2", N4" that generate a potential of the node V2" is omitted from the circuit of FIG. 17. The power source voltage VSS2 is applied to a gate of the PMOS load transistor P1'. In order to become the power source voltage VSS2 in place of the node V2", the output potential Vout becomes somewhat high. However, an error can be compensated by making a value of the resistance element R1 in VSS2 voltage generator to be somewhat small. Since one constant current path is deleted, electrical power can be made lower.

The present embodiment has a configuration in which the substrate potential (low power source voltage) GND and the low power source voltage VSS2 are switched as the low power source voltage of the SRAM cell array. The power source voltage VSS2 higher than the substrate power source GND by a corresponding amount of a writing margin WM1 is applied as the low power source of the SRAM cell array at writing. By switching to the low power source voltage VSS2 at writing, a semiconductor memory device that can carry out a stable operation at high speed is obtained.

Embodiment 5

Figure 21:
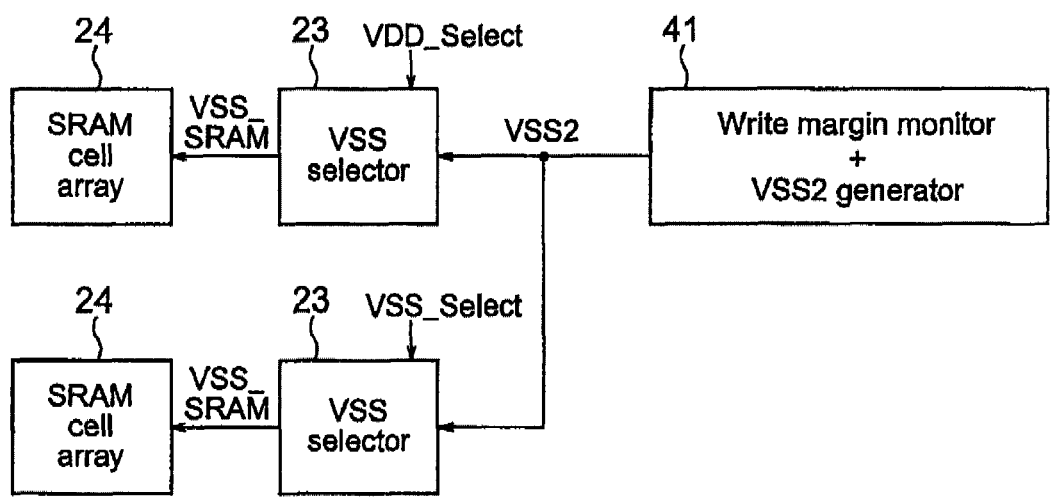
FIG. 21 is an overall block diagram in the case where a writing margin/voltage generator 41 is applied to control a power source VSS_SRAM of a SRAM cell according to Embodiment 5.
Figure 22:
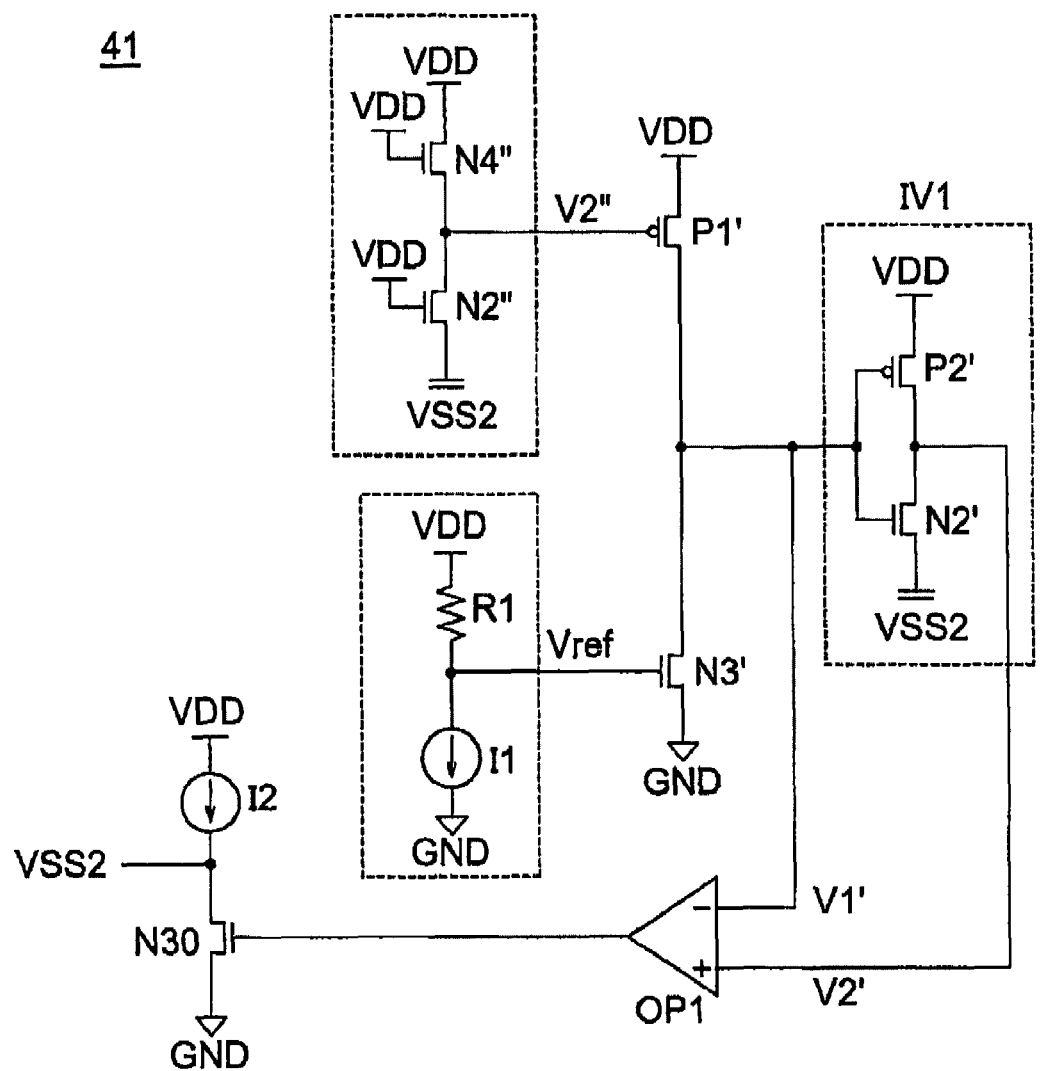
FIG. 22 is a circuit diagram of the writing margin/voltage generator 41 according to Embodiment 5.

Embodiment 5 of the present invention will be described with reference to FIGS. 21 to 23. The present embodiment is an embodiment in which the writing margin monitoring circuit 21 and the VSS2 voltage generator 22 of Embodiment 4 are incorporated. FIG. 21 shows an overall block configuration diagram in the case where a writing margin monitor/voltage generator 41 is used for control of a power source VSS_SRAM of a SRAM cell. The writing margin monitor/voltage generator 41 is shown in FIG. 22, and another writing margin monitor/voltage generator 41 is shown as another form in FIG. 23.

FIG. 21 shows a block configuration diagram in the case where the writing margin monitor/voltage generator 41 is used for control of the power source VSS_SRAM of the SRAM cell. It is constructed from the writing margin monitor/voltage generator 41, a VSS2 voltage generator 23 and a SRAM cell array 24.

In the VSS2 voltage generator of FIG. 18, the operational amplifier OP2 controls the power source voltage VSS2 so that the potential Vref equals the output Vout of the writing margin monitoring circuit 21. Thus, even in the writing margin monitor/voltage generator 41 shown in FIG. 22, the reference potential Vref is directly inputted to the gate of the NMOS transistor N3', and the output of the operational amplifier OP1 is inputted to the gate terminal of the NMOS transistor N30. By this configuration, the power source voltage VSS2 is controlled so that the reference potential Vref equals the output Vout of the writing margin monitoring circuit portion. The writing margin monitor/voltage generator 41 integrates the writing margin monitoring circuit and the voltage generator, whereby the operational amplifier OP2 can be omitted.

Figure 23:
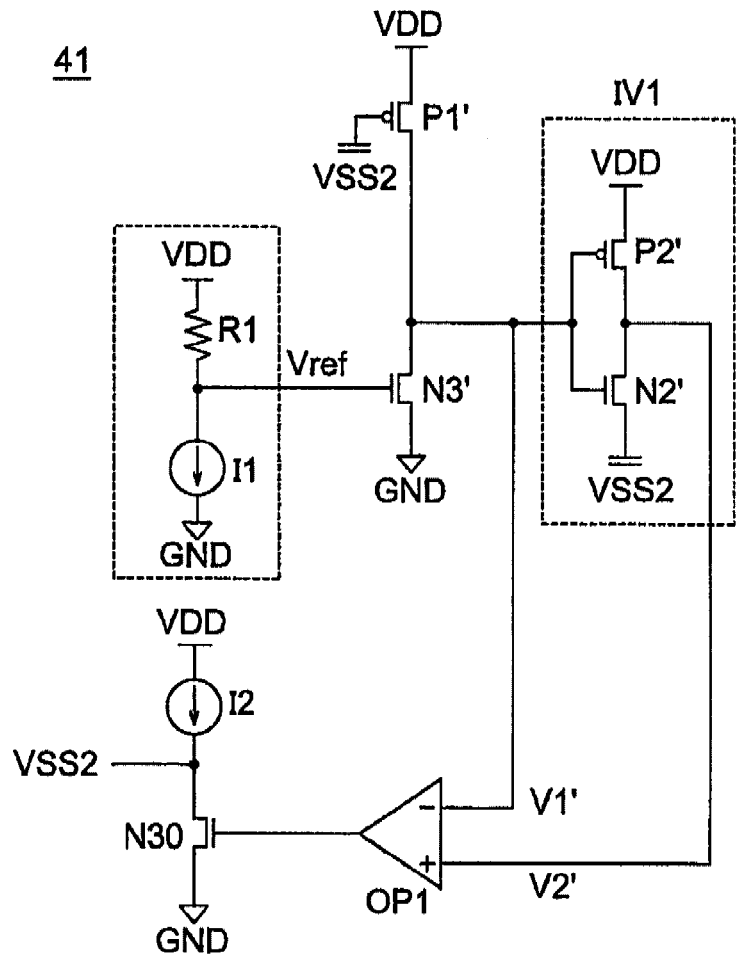
FIG. 23 is a circuit diagram showing another form of the writing margin/voltage generator 41 according to Embodiment 5.
Figure 24:
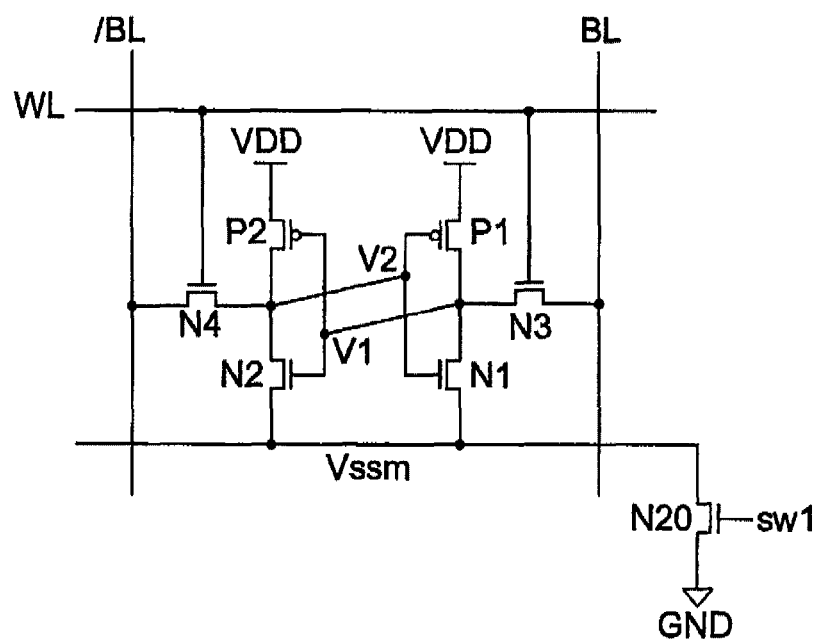
FIG. 24 is an explanatory drawing for a conventional writing margin improved method 2.

Another form of the voltage generator 41 shown in FIG. 23 is a configuration in which the transistors N2", N4" that generate a potential of the node V2" are omitted. In order for the potential of the node V2" to become the power source voltage VSS2, the current of the PMOS transistor P1' increases somewhat. However, an error can be compensated by making a value of the resistance element R1 to be somewhat small. Since one constant current path is deleted, electrical power can be made lower.

The present embodiment has a configuration in which the low power source voltage (substrate potential) GND and the low power source voltage VSS2 are switched as the low power source of the SRAM cell array. The power source voltage VSS2 higher than the substrate power source GND by a corresponding amount of a writing margin WM1 is applied as the low power source of the SRAM cell array at writing. By switching to the low power source voltage VSS2 at writing, a semiconductor memory device that can carry out a stable operation at high speed is obtained.

As described above, although the present invention has been described on the basis of the embodiments, the present invention is not limited to the embodiments. It is obvious that various modifications can be made without departing from the scope of the present invention.

The invention claimed is:

1. A semiconductor memory device comprising a writing margin monitoring circuit, the writing margin monitoring circuit comprising a simulation circuit in which a replicated load transistor and a replicated access transistor are connected in series, the replicated load transistor and the replicated access transistor respectively simulating a load transistor and an access transistor of a SRAM cell so that a current flowing to the access transistor that discharges a potential of a storage node of the SRAM cell equals a current flowing to the load transistor of the SRAM cell at a writing operation.

2. The semiconductor memory device as claimed in claim 1, wherein the writing margin monitoring circuit further comprises a second replicated load transistor, a replicated inverter circuit constructed from a replicated drive transistor and an operational amplifier, the replicated inverter circuit outputs a second output signal when a first output signal is inputted from the simulation circuit, the first output signal and the second output signal are inputted to the operational amplifier, and an output signal of the operational amplifier that is an output signal of the writing margin monitoring circuit is outputted as gate voltage of the replicated access transistor.

3. The semiconductor memory device as claimed in claim 2, wherein voltage of the first output signal is equal to threshold value voltage of first and second inverters that configure the SRAM cell and are loop-connected.

4. The semiconductor memory device as claimed in claim 2, wherein each of the replicated load transistor and the second replicated load transistor is constructed from a transistor having the same characteristic as that of the load transistor that configures the SRAM cell, the replicated access transistor is constructed from a transistor having the same characteristic as that of the access transistor that configures the SRAM cell, and the replicated drive transistor is constructed from a transistor having the same characteristic as that of a drive transistor that configures the SRAM cell.

5. The semiconductor memory device as claimed in claim 2, wherein an output signal from a node at which a second replicated access transistor is connected to a second replicated drive transistor in series is inputted to a gate of the replicated load transistor.

6. The semiconductor memory device as claimed in claim 2, wherein low power source voltage is inputted to a gate of the replicated load transistor.

7. The semiconductor memory device as claimed in claim 1, further comprising a voltage generator and a power source selector, wherein the power source selector switches second high power source voltage or second low power source voltage generated by the voltage generator to apply it as a power source of the SRAM cell at writing.

8. The semiconductor memory device as claimed in claim 7, wherein the voltage generator outputs the second power source voltage or the second low power source voltage by controlling an output transistor by means of an output of an operational amplifier to which reference voltage that is lowered by margin voltage from high power source voltage and output voltage from the writing margin monitoring circuit are inputted.

9. The semiconductor memory device as claimed in claim 1, wherein the writing margin monitoring circuit further comprises a second replicated load transistor, a replicated inverter circuit constructed from a replicated drive transistor, an operational amplifier and a voltage generator, the replicated inverter circuit outputs a second output signal when a first output signal is inputted from the simulation circuit, the first output signal and the second output signal are inputted to the operational amplifier, and the voltage generator outputs second high power source voltage or second low power source voltage by controlling an output transistor by means of an output signal from the operational amplifier.

10. The semiconductor memory device as claimed in claim 9, wherein reference voltage that is lowered by margin voltage from high power source voltage is inputted to a gate of the replicated access transistor.

11. The semiconductor memory device as claimed in claim 9, wherein either the second high power source voltage and low power source voltage or high power source voltage and the second low power source voltage are applied as a power source of the replicated inverter circuit.

12. The semiconductor memory device as claimed in claim 9, further comprising a power source selector, wherein the power source selector switches the second high power source voltage or the second low power source voltage to apply it as a power source of the SRAM cell at writing.

13. A method of controlling a power source of a semiconductor memory device, the semiconductor memory device comprising a simulation circuit, a replicated inverter circuit, an operational amplifier, a voltage generator and a power source selector, the simulation circuit being constructed from a replicated load transistor and a replicated access transistor that respectively simulate a load transistor and an access transistor that configure a SRAM cell, the replicated inverter circuit being constructed from second replicated load transistor and replicated drive transistor to which an output from the simulation circuit is inputted, outputs from the simulation circuit and the replicated inverter circuit being inputted to the operational amplifier, the voltage generator generating second high power source voltage or second low power source voltage by means of an output from the operational amplifier, wherein when a writing instruction is inputted, the power source selector applies either the second high power source voltage and low power source voltage or high power source voltage and the second low power source voltage as a power source of the SRAM cell.

14. The method of controlling the power source of the semiconductor memory device as claimed in claim 13, wherein when a writing instruction is inputted, the power source selector applies the second high power source voltage and the low power source voltage or the high power source voltage and the second low power source voltage as a power source of the replicated inverter circuit.

* * * * *